(12) United States Patent
Arai et al.

(10) Patent No.: US 6,404,126 B1
(45) Date of Patent: *Jun. 11, 2002

(54) ORGANIC ELECTROLUMINESCENT DEVICE HAVING A CONJUGATED POLYMER AND AN INORGANIC INSULATIVE ELECTRON INJECTING AND TRANSPORTING LAYER

(75) Inventors: Michio Arai; Osamu Onitsuka, both of Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/339,877

(22) Filed: Jun. 25, 1999

(30) Foreign Application Priority Data

Nov. 25, 1998 (JP) ............................................. 10-350762

(51) Int. Cl.⁷ .......................... H05B 33/22; H05B 33/20
(52) U.S. Cl. ...................... 313/503; 313/499; 313/506; 257/96; 257/103; 428/917
(58) Field of Search .................................. 313/502, 503, 313/504, 509, 498, 506, 499; 257/96, 103, 40, 94; 428/690, 917

(56) References Cited

U.S. PATENT DOCUMENTS

| | | |
|---|---|---|
| 5,247,190 A | 9/1993 | Friend et al. |
| 5,399,502 A | 3/1995 | Friend et al. |
| 5,952,779 A | 9/1999 | Arai et al. |
| 5,969,474 A | 10/1999 | Arai |
| 6,111,274 A * | 8/2000 | Arai ............................ 257/96 |
| 6,166,488 A * | 12/2000 | Arai ............................ 313/504 |
| 6,198,219 B1 * | 3/2001 | Arai et al. .................. 313/504 |
| 6,252,246 B1 * | 6/2001 | Arai et al. .................... 257/40 |

FOREIGN PATENT DOCUMENTS

| | | |
|---|---|---|
| EP | 0 423 283 | 4/1991 |
| JP | 3-105898 | 5/1991 |
| JP | 8-288069 | 11/1996 |
| JP | 10-92576 | 4/1998 |
| JP | 10-92577 | 4/1998 |
| JP | 10-125474 | 5/1998 |
| JP | 10-270172 | 10/1998 |
| JP | 10-340787 | 12/1998 |
| JP | 11-500574 | 1/1999 |
| WO | WO 96/29747 | 9/1996 |

* cited by examiner

*Primary Examiner*—Ashok Patel
(74) *Attorney, Agent, or Firm*—Oblon, Spivak, McCelland, Maier & Neustadt, P.C.

(57) ABSTRACT

An organic electroluminescent device having high efficiency, a long life time, and low cost, includes a substrate, a hole injecting electrode and an electron injecting electrode formed on the substrate, an organic material-containing organic layer between the electrodes, and an inorganic insulative electron injecting and transporting layer between the light emitting layer and the electron injecting electrode. The organic layer includes a light emitting layer containing a conjugated polymer, and the inorganic insulative electron injecting and transporting layer comprises three components. The first component is at least one oxide selected from the group consisting of lithium oxide, rubidium oxide, potassium oxide, sodium oxide, and cesium oxide. The second component is at least one of strontium oxide, magnesium oxide, and calcium oxide. The third component consists of silicon oxide, germanium oxide, or mixtures thereof.

25 Claims, 2 Drawing Sheets

ORGANIC ELECTROLUMINESCENT DEVICE HAVING A CONJUGATED POLYMER AND AN INORGANIC INSULATIVE ELECTRON INJECTING AND TRANSPORTING LAYER

BACKGROUND OF THE INVENTION

Technical Field

This invention relates to an organic electroluminescent (EL) device and more particularly, to an inorganic/organic junction structure suitable for use in a device of the type wherein an electric field is applied to a thin film of an organic compound to emit light.

Background Art

Active research works have been made on organic EL devices for use as displays because EL devices can be formed on a large area of glass. In general, organic EL devices have a basic configuration including a glass substrate, a transparent electrode of tin-doped indium oxide (ITO) etc., a hole transporting layer of an organic amine compound, a light emitting layer of an organic fluorescent material exhibiting electronic conductivity and intense light emission such as an aluminum quinolinol complex (Alq3), and an electrode of a metal having a low work function such as MgAg, wherein the layers are stacked on the substrate in the described order.

The device configurations which have been reported thus far have one or more organic compound layers interposed between a hole injecting electrode and an electron injecting electrode. Structures having two or three organic compound layers are typical.

Included in the two-layer structure are a structure having a hole transporting layer and a light emitting layer formed between the hole injecting electrode and the electron injecting electrode and another structure having a light emitting layer and an electron transporting layer formed between the hole injecting electrode and the electron injecting electrode. Included in the three-layer structure is a structure having a hole transporting layer, a light emitting layer, and an electron transporting layer formed between the hole injecting electrode and the electron injecting electrode. Also known is a one-layer structure wherein a single layer playing all the roles is formed from a polymer or a mixed system.

FIGS. 3 and 4 illustrate typical configurations of organic EL devices.

In FIG. 3, a hole transporting layer 14 and a light emitting layer 15, both of organic compounds, are formed between a hole injecting electrode 12 and an electron injecting electrode 13 on a substrate 11. In this configuration, the light emitting layer 15 also serves as an electron transporting layer.

In FIG. 4, a hole transporting layer 14, a light emitting layer 15, and an electron transporting layer 16, all of organic compounds, are formed between a hole injecting electrode 12 and an electron injecting electrode 13 on a substrate 11.

Reliability is a common problem to be solved for these organic EL devices. More particularly, organic EL devices in principle have a hole injecting electrode and an electron injecting electrode and need organic layers for effectively injecting and transporting holes and electrons from the electrodes, respectively. However, the organic materials of which the organic layers are formed are vulnerable during manufacture and have less affinity to the electrodes. Another problem is raised by the significantly accelerated degradation of organic thin films as compared with light emitting diodes (LED) and laser diodes (LD).

The EL devices emit light under the influence of an electric field. The function of a semiconductor layer constituting such an EL device is based on the radiative recombination of electron-hole pairs injected from a pair of electrodes into the semiconductor. Exemplary devices are light emitting diodes (LED) based on GaP and similar Group III-Group V semiconductors. Although these devices are effectively and widely utilized, their size is so small that it is not only difficult, but also uneconomical to apply the LEDs to large area displays. Several types of materials are known as the substitutes applicable to large area displays. Of these inorganic semiconductors, ZnS is most useful. The ZnS system, however, suffers from serious practical drawbacks including the lack of reliability. One exemplary mechanism associated with ZnS is deemed to be that carriers of one type are accelerated through the semiconductor under a strong electric field, to induce the local excitation of the semiconductor which is relaxed by radiative light emission.

It is known that of organic materials, simple aromatic molecules such as anthracene, perylene, and coronene are electroluminescent.

On practical use, these organic materials have the problems that they lack reliability like ZnS, and joining layers of these materials to current-injecting electrode layers is difficult.

The technique of depositing organic materials through sublimation leaves the problem that the resulting layers are soft and likely to recrystallize.

The technique of building up properly modified aromatic compounds by Langmuir-Blodgett method invites deterioration of film quality, dilution of active material, and an increase of manufacturing cost.

An EL device using anthracene is disclosed in U.S. Pat. No. 3,621,321. This device has the inconveniences of increased power consumption and low luminescence.

Another attempt to provide an improved device is U.S. Pat. No. 4,672,265 which discloses an EL device comprising a luminescent layer of a double layer structure.

However, the materials used in the double layer structure are organic materials having the above-mentioned inconveniences.

JP-A 10-92576 discloses an EL device comprising a semiconductor layer in the form of a thin dense polymer film composed of at least one conjugated polymer, a first contact layer adjoining a first surface of the semiconductor layer, and a second contact layer adjoining a second surface of the semiconductor layer. The polymer film of which the semiconductor layer is formed has a sufficiently low concentration of external charge carriers so that, when an electric field is applied between the first and second contact layers across the semiconductor layer with the second contact layer made positive relative to the first contact layer, charge carriers are injected into the semiconductor layer whereby the semiconductor layer emits light.

Conjugated polymers themselves are known, and their application to optical modulators, for example, is disclosed in European Patent Application No. 0294061. Polyacetylene is used as an active layer in a modulating structure between first and second electrodes. An insulating layer must be disposed between one electrode and the active layer so as to form a space charge region in the active layer providing an optical modulation effect. Nevertheless, the presence of the space charge region disables formation of electron-hole pairs that emit light through their decay. Therefore, such a structure fails to exert electroluminescence. The development of electroluminescence is utterly undesirable in European Patent Application No. 0294061 because the optical modulation effect is destroyed thereby.

To solve these problems, it is contemplated to utilize the advantages of both an organic material and an inorganic semiconductor material. Specifically, an organic/inorganic semiconductor junction is given by substituting an organic p-type semiconductor for the organic hole transporting layer. Such studies are disclosed in Japanese Patent No. 2636341, JP-A 2-139893, 2-207488, and 6-119973. However, it is difficult to design devices which surpass conventional organic EL devices with respect to luminescent performance and device reliability.

SUMMARY OF THE INVENTION

An object of the present invention is to provide an organic EL device capable of utilizing the advantages of both organic and inorganic materials and having a high efficiency, long lifetime, and low cost.

This and other objects are achieved by the present invention which is defined below.

(1) An organic electroluminescent device comprising a substrate, a hole injecting electrode and an electron injecting electrode formed on the substrate, and an organic material-containing organic layer between the electrodes, the organic layer including a light emitting layer containing a conjugated polymer, the device further comprising an inorganic insulative electron injecting and transporting layer between the light emitting layer and the electron injecting electrode, the inorganic insulative electron injecting and transporting layer comprising at least one oxide selected from the group consisting of lithium oxide, rubidium oxide, potassium oxide, sodium oxide, and cesium oxide as a first component, at least one oxide selected from the group consisting of strontium oxide, magnesium oxide, and calcium oxide as a second component, and silicon oxide, germanium oxide or a mixture of silicon oxide and germanium oxide as a third component.

(2) The organic electroluminescent device of (1) wherein the inorganic insulative electron injecting and transporting layer contains 5 to 95 mol % of the first component, 5 to 95 mol % of the second component, and 5 to 95 mol % of the third component, based on the entire components.

(3) The organic electroluminescent device of (1) wherein the inorganic insulative electron injecting and transporting layer has a thickness of 0.1 to 2 nm.

(4) The organic electroluminescent device of (1) wherein the electron injecting electrode is formed of at least one metal element selected from the group consisting of Al, Ag, In, Ti, Cu, Au, Mo, W, Pt, Pd, and Ni.

(5) The organic electroluminescent device of (1) further comprising an inorganic insulative hole injecting and transporting layer between the light emitting layer and the hole injecting electrode, the inorganic insulative hole injecting layer comprising silicon oxide or germanium oxide or a mixture of silicon oxide and germanium oxide as a main component, the main component having an average composition represented by the formula: $(Si_{1-x}Ge_x)O_y$ wherein x is from 0 to 1 and y is from 1.7 to 1.99, as analyzed by Rutherford back-scattering.

(6) The organic electroluminescent device of (5) wherein the inorganic insulative hole injecting and transporting layer has a thickness of 0.1 to 3 nm.

FUNCTION

In the organic EL device of the invention, the conjugated polymer used in the light emitting layer is preferably poly (p-phenylene vinylene). The polymer film preferably has a generally uniform thickness in the range of 10 nm to 5 μm. The conjugated polymer preferably has a semiconductor band gap in the range of 1 eV to 3.5 eV. Also preferably, the proportion of the conjugated polymer in an electroluminescent zone in the polymer film is sufficient to achieve the percolation threshold to ensure charge transfer within the conjugated polymer in the film.

The conjugated polymer designates a polymer having a nonlocalized π electron system along its main skeleton. The nonlocalized π electron system endows the polymer with semiconductive properties as well as an ability to carry positive and negative charge carriers having a high mobility along the polymer skeleton.

Such polymers are discussed by R. H. Friend in Journal of Molecular Electronics, 4 (1988), January–March, No. 1, pp. 37–46, for example.

In the organic EL device, the hole injecting electrode and hole injecting layer serve to inject positive charge carriers into the polymer film whereas the electron injecting electrode and electron injecting layer serve to inject negative charge carriers into the polymer film. These charge carriers are combined to form charge pairs susceptible to radiative decay. For this reason, it is preferred that the hole and electron injecting electrodes be selected so as to have high and low work functions, respectively.

To acquire the desired electroluminescence, the polymer film is preferably substantially free of defects which act as the center of non-luminescent recombination. Such defects obstruct the electroluminescence.

In addition to the charge injecting function, the inorganic insulative hole injecting and transporting layer or electron injecting and transporting layer, at least one of which is formed, serves to control the ratio of electrons to holes injected into the electroluminescent layer and to ensure that radiative decay occurs apart from the charge injecting material of the layer in contact therewith.

The film of conjugated polymer is preferably composed of a single conjugated polymer or a single copolymer comprising segments of a conjugated polymer. Alternatively, the film of conjugated polymer may be composed of a mixture of a conjugated polymer or copolymer and another suitable polymer.

Further preferred characteristics of the polymer film are given below. (i) The polymer is stable upon exposure to oxygen, humidity and high temperature. (ii) The polymer film has good adhesion to the underlying layer, an ability to inhibit the occurrence of cracks caused by temperature rise and pressure bias, and resistance to shrinkage, expansion, recrystallization or other morphological changes. (iii) Owing to high crystallinity and a high melting point, for example, the polymer film is recoverable with respect to an ion/atom transfer step.

DESCRIPTION OF THE PREFERRED EMBODIMENTS

Figure 1:
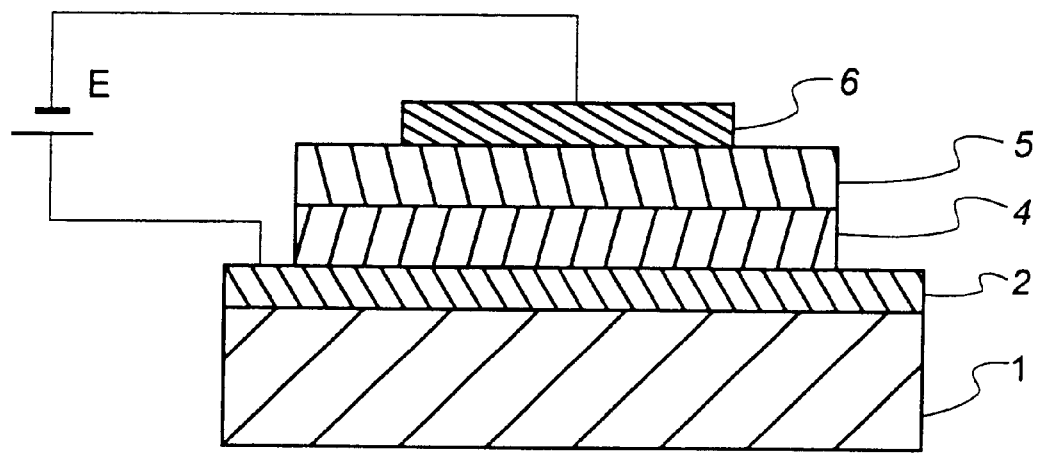
FIG. 1 is a schematic cross-sectional view illustrating the configuration of an organic EL device according to a first embodiment of the invention.

The organic EL device of the invention includes a pair of a hole injecting electrode and an electron injecting electrode, and an organic layer participating in a light emitting function disposed between the electrodes, the organic layer including a light emitting layer comprising a conjugated polymer. The device further includes an inorganic insulative electron injecting and transporting layer disposed between the light emitting layer and the electron injecting electrode.

When combined with the inorganic electron injecting and transporting layer to be described later, the negative electrode is not critical because it need not have a low work function and an electron injecting ability. Conventional metals may be used. Inter alia, one or more metal elements selected from among Al, Ag, In, Ti, Cu, Au, Mo, W, Pt, Pd and Ni, especially Al and Ag are preferable for conductivity and ease of handling.

The negative electrode thin film may have at least a sufficient thickness to supply electrons to the inorganic electron injecting and transporting layer, for example, a thickness of at least 50 nm, preferably at least 100 nm. Although the upper limit is not critical, the film thickness is typically about 50 to about 500 nm.

In the organic EL device of the invention, when combined with the inorganic electron injecting and transporting layer to be described later, the negative electrode preferably uses the above-described metals although the following materials may also be used if necessary. Exemplary materials are, for example, single metal elements such as K, Li, Na, Mg, La, Ce, Ca, Sr, Ba, Sn, Zn, and Zr, binary or ternary alloys consisting of two or three of these elements for improving stability, such as Ag—Mg (Ag: 0.1 to 50 at %), Al—Li (Li: 0.01 to 14 at %), In—Mg (Mg: 50 to 80 at %), and Al—Ca (Ca: 0.01 to 20 at %).

The electron injecting electrode thin film may have a sufficient thickness to effect electron injection, for example, a thickness of at least 0.1 nm, preferably at least 0.5 nm, more preferably at least 1 nm. Although the upper limit is not critical, the film thickness is typically about 1 to about 500 nm. On the electron injecting electrode, an auxiliary or protective electrode may be provided, if desired.

The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, accelerating the growth rate of dark spots.

For the auxiliary electrode, an appropriate material may be chosen in consideration of the material of the electron injecting electrode to be combined therewith. For example, low resistivity metals such as aluminum may be used when electron injection efficiency is of importance. Metal compounds such as TiN may be used when sealing is of importance.

The thickness of the electron injecting electrode and the auxiliary electrode combined is usually about 50 to about 500 nm though it is not critical.

The hole injecting electrode is preferably formed of materials capable of effectively injecting holes into the hole injecting layer, more preferably materials having a work function of 4.5 to 5.5 eV. Illustratively, materials based on tin-doped indium oxide (ITO), zinc-doped indium oxide (IZO), indium oxide ($In_2O_3$), tin oxide ($SnO_2$) or zinc oxide (ZnO) are preferable. These oxides may deviate somewhat from their stoichiometry. An appropriate proportion of $SnO_2$ mixed with $In_2O_3$ is about 1 to 20%, more preferably about 5 to 12% by weight. For IZO, an appropriate proportion of ZnO mixed with $In_2O_3$ is about 12 to 32% by weight.

The hole injecting electrode may contain silicon oxide ($SiO_2$) for adjusting the work function. When added to ITO, the content of silicon oxide is preferably about 0.5 to 10 mol % of ITO. The inclusion of silicon oxide increases the work function of ITO.

The electrode on the light exit side should preferably have a light transmittance of at least 80%, especially at least 90% in the light emission band, typically from 400 to 700 nm, and especially at each light emission. With a lower transmittance, the light emitted by the light emitting layer would be attenuated through the electrode, failing to provide a luminance necessary as a light emitting device.

Preferably the electrode has a thickness of 50 to 500 nm, especially 50 to 300 nm. Although the upper limit of the electrode thickness is not critical, a too thick electrode would cause a drop of transmittance and separation. Too thin an electrode would be insufficient for its effect and low in film strength during fabrication.

The light emitting layer contains a conjugated polymer. The conjugated polymer used in the light emitting layer is preferably poly(p-phenylene vinylene), abbreviated as PPV, of the following formula (I).

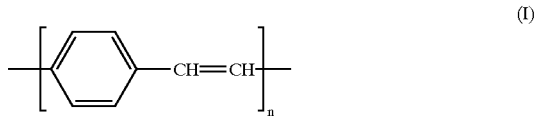
(I)

In the formula, the phenylene ring may have one or more substituents independently selected from among alkyl (preferably methyl), alkoxy (preferably methoxy or ethoxy), halogen (preferably chloro or bromo), and nitro, if desired.

Other conjugated polymers derived from poly(p-phenylene vinylene) are also appropriate as the conjugated polymer used herein.

Typical examples of these derivatives are shown below.

(i) Polymers of the structure represented by formulae (II) to (IV): They are obtained by substituting a fused ring for the phenylene ring in formula (I), for example, by substituting an anthracene or naphthalene ring for the phenylene ring.

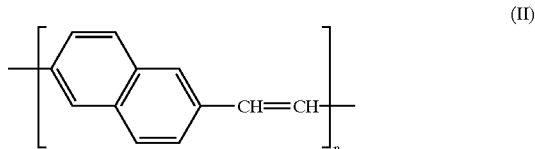
(II)

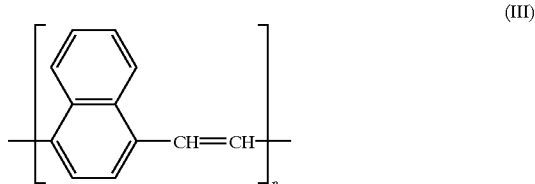
(III)

-continued

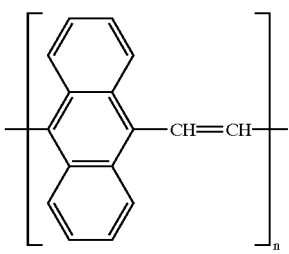
(IV)

These polycyclic systems may also have one or more substituents as described in conjunction with the phenylene ring.

(ii) Polymers of the structure represented by formula (V): They are obtained by substituting a heterocyclic ring such as a furan ring for the phenylene ring.

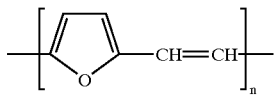
(V)

The furan ring may also have one or more substituents as described in conjunction with the phenylene ring.

(iii) Polymers of the structure represented by formulae (VI) to (VIII): They are obtained by increasing the number of vinylene moieties attached to respective phenylene rings or other rings described above in (i) or (ii).

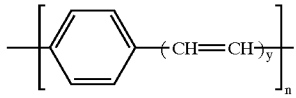
(VI)

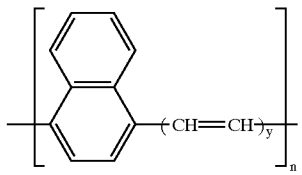
(VII)

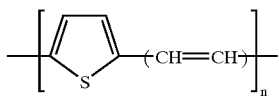
(VIII)

In the above structural formulae, y is equal to 2, 3, 4, 5, 6 or 7. Usually, n is from about 3 to about 10,000.

These rings may also have one or more substituents as described in conjunction with the phenylene ring.

These distinct PPV derivatives have different semiconductor energy gaps. By properly selecting and mixing PPVs having different semiconductor energy gaps, it becomes possible to construct an EL device which emits light at different wavelengths over the entire visible spectrum.

The conjugated polymer film can be prepared by chemically treating and/or heat treating a polymer "precursor" which is solution or melt processable. The polymer precursor can be purified or pretreated into a desired shape before it is subsequently converted into a conjugated polymer through elimination reaction.

Films of the above-described PPV derivatives may be similarly formed on organic EL structures using suitable sulfonium precursors.

It is sometimes advantageous to use a polymer precursor having a higher solubility in an organic solvent than a sulfonium salt precursor (II). The solubility of the precursor in an organic solvent can be increased by substituting a less hydrophilic group such as an alkoxy group (typically methoxy) or pyridinium group for the sulfonium moiety in the precursor.

Typically, on a substrate having formed thereon an electrode and optionally a hole injecting layer, electron injecting layer or the like, a film of poly(phenylene vinylene) can be formed by a method based on the following reaction scheme.

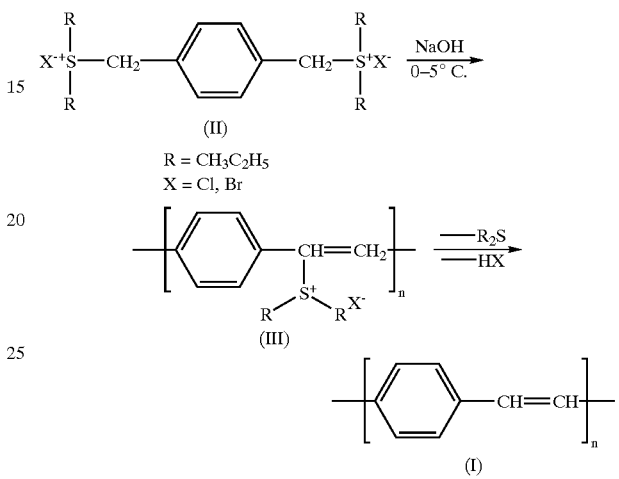

In an aqueous solution, water/ethanol mixture or methanol, the sulfonium salt monomer (II) is converted into a polymer precursor (III). The solution of prepolymer (III) can be applied onto a substrate by the conventional spin coating technique commonly used for photoresist processing in the semiconductor industry. Otherwise, a coating may be formed by casting, dipping, bar coating, roll coating and other techniques. The thus obtained polymer precursor (III) film is then converted into poly(phenylene vinylene) (I), typically by heating at a temperature of 200 to 350° C.

With respect to the conditions required for the chemical synthesis of monomer (II), polymerization of monomer (II) into precursor (III), and thermal conversion of precursor (III) into PPV (I), reference should be made to the literature, for example, D. D. C. Bradley, J. Phys. D (Applied Physics), 20, 1389 (1987) and J. D. Stenger Smith, R. W. Lenz and G. Wegner, Polymer, 30, 1048 (1989).

The film of poly(phenylene vinylene) preferably has a thickness of 0.1 nm to 10 µm, more preferably 0.5 nm to 1 µm, most preferably 10 to 500 nm. The PPV film has only few pinholes. The PPV film has a semiconductor energy gap of about 2.5 eV (500 nm). The PPV film is tough, substantially inert to oxygen at room temperature, and stable to gases other than air at temperatures in excess of 300° C.

By modifying the leaving group on the polymer precursor to ensure that elimination reaction proceeds as single reaction without forming another intermediate structure, the ordering of the material can be improved. Therefore, for example, the n-dialkylsulfonium component can be replaced by a tetrahydrothiophenium component. The latter component is eliminated as a single leaving group without being decomposed into alkyl mercaptan as is the dialkylsulfide. The polymer precursor used in the example described herein encompasses those in which dimethylsulfide and tetratryebrothiophene are selected as the dialkylsulfonium component. These precursors form PPV films appropriate for use in organic EL devices.

Additionally, the preferred material of which the conjugated polymer film is formed is poly(phenylene).

This material can be prepared by starting with derivatives which are biochemically synthesized from 5,6-dihydroxycyclohexa-1,3-diene. Using radical initiators, these derivatives can be polymerized into polymer precursors which are soluble in a single solvent. The preparation of poly(phenylene) is described in Ballard et al, J. Chem. Comm., 954 (1983).

A solution of the polymer precursor is spin coated onto a substrate as a thin film, which is converted into conjugated poly(phenylene) polymer by heat treating typically at a temperature of 140 to 240° C.

In forming a phenylene copolymer, copolymerization may be similarly effected using a vinyl or diene monomer.

Other preferred types of material that can be used in forming conjugated polymer films include conjugated polymers which themselves are solution processable or melt processable due to the presence of a giant side-chain group attached to a primary conjugated chain or by incorporating a conjugated polymer into a copolymer structure in which one or more components are non-conjugated. Examples of the former conjugated polymers are given below.

(a) Poly(4,4'-diphenylene diphenyl vinylene), abbreviated as PDPV, is an arylene vinylene polymer in which the carbons in both vinylene moieties are substituted with phenyl rings. Since this polymer is soluble in ordinary organic solvents, a thin film can be formed therefrom.

(b) Poly(1,4-phenylene-1-phenylvinylene) and poly(1,4-phenylene diphenyl vinylene) are analogous to PPV. They are polymers in which the carbon or carbons in one or both vinylene moieties are substituted with phenyl groups. They are soluble in organic solvents and can be cast or spin coated to form thin films.

(c) Poly(3-alkylthiophene) polymers wherein the alkyl is selected from among propyl, butyl, pentyl, hexyl, heptyl, octyl, decyl, undecyl, dodecyl, etc. are solution processable in ordinary organic solvents, and melt processable depending on the long alkyl sequence (alkyl is equal to or longer than octyl).

(d) Poly(3-alkylpyrrole) polymers are expected to be analogous to the poly(3-alkylthiophene) polymers.

(e) Poly(2,5-dialkoxy-p-phenylene vinylene) polymers in which the alkyl is longer than butyl are solution processable.

(f) Poly(phenylacetylene) polymers are polyacetylene derivatives in which a hydrogen atom on the backbone is replaced by a phenyl group. This replacement renders the polymers soluble.

In order to ensure processability necessary for polymers and facilitate formation of a uniform thin film onto a substrate (having an electrode and necessary functional thin films formed thereon), it is sometimes suitable to form a polymer blend of a conjugated polymer and another polymer.

When such a copolymer or a polymer blend is used in forming a conjugated polymer film, the active sites in the EL device having the conjugated polymer film incorporated therein must contain a number of conjugated polymer sites which are equal to or greater than the percolation threshold of the copolymer or polymer blend.

The light emitting layer is formed as a composite layer including polymer layers having different band gaps and/or majority charge species, which achieves the concentration of electric charges injected from the hole/electron injecting layers into the light emitting layer or a specific region within the light emitting layer. The composite layer can be formed by continuous precipitation of polymer layers. When a different film is applied to a conjugated polymer in the form of a precursor by spin or draw coating, that film is made insoluble by the conversion step to conjugated polymer, the subsequent layer can be similarly applied without dissolving the previously applied film.

Further, the following polymers requiring no heat polymerization step may be used as the conjugated polymer in the light emitting layer.

Useful conjugated polymers are soluble in solvents, have a number average molecular weight of $10^3$ to $10^7$, have a structure of continuous conjugated bonds, have recurring units of at least two different types, each recurring unit having at least one conjugated bond, and form a thin film exhibiting such properties that the difference between the peak wavelength of its absorption spectrum and the peak wavelength of its fluorescent spectrum is at least 120 nm. More preferred are conjugated polymers containing 0.01 to 40 mol % of the recurring units that respectively form homopolymers whose optical absorption edge energy is minimum. It is noted that the number average molecular weight is determined by gel permeation chromatography (GPC) using chloroform as the solvent and calculated on the basis of polystyrene.

From the standpoint of providing conjugated polymer fluorescent materials having a high fluorescence quantum yield, the conjugated polymer fluorescent materials are preferably conjugated polymers comprising recurring structures represented by the following formulae (1) to (3). More preferred are conjugated polymers comprising recurring structures having alternately joined vinylene and aryl or heterocyclic groups, represented by the following formulae (4) and (5).

The preferred recurring units of the conjugated polymers used herein are divalent aromatic compound groups or derivative groups and divalent heterocyclic compound groups or derivative groups shown below.

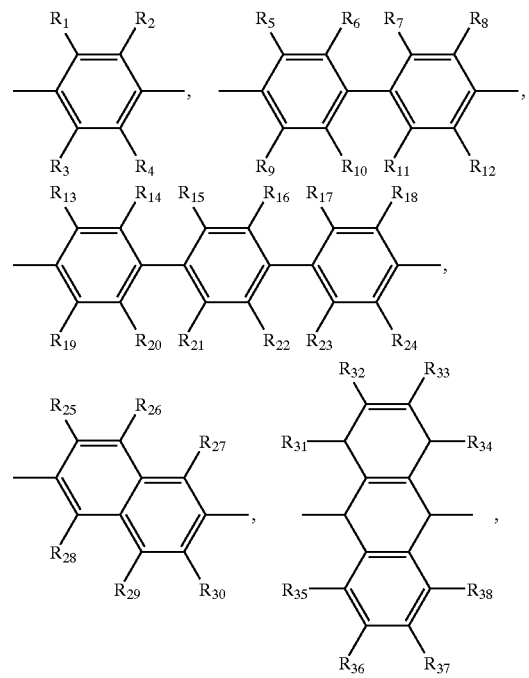

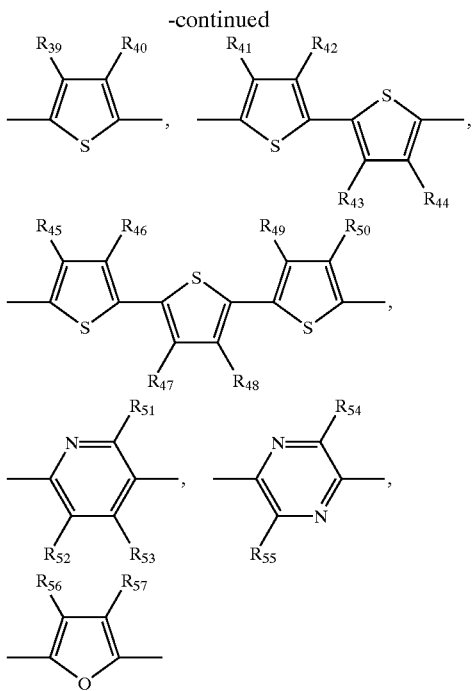

Herein, $R_1$ to $R_{57}$ are independently hydrogen, alkyl, alkoxy and alkylthio groups of 1 to 20 carbon atoms, aryl and aryloxy groups of 6 to 18 carbon atoms, or heterocyclic compound groups of 4 to 14 carbon atoms.

Exemplary are a combination of a divalent aromatic compound group or derivative group with a vinylene group, and a combination of a divalent heterocyclic compound group or derivative group with a vinylene group, as shown by the following formulae (1) to (5).

—Ar1-CH=CH—  (1)

—Ar2-CH=CH—  (2)

—Ar3-CH=CH—  (3)

Herein, Ar1, Ar2, and Ar3, which are different from each other, are arylene groups or divalent heterocyclic compound groups each forming a conjugated bond continuous to the vinylene group, and at least one of Ar1, Ar2 and Ar3 is an arylene or heterocyclic compound group having at least one substituent selected from the class consisting of alkyl, alkoxy or alkylthio groups of 4 to 22 carbon atoms, aryl or aryloxy groups of 6 to 60 carbon atoms, and heterocyclic compound groups of 4 to 60 carbon atoms.

—Ar4-CH=CH—Ar5-CH=CH—  (4)

—Ar5-CH=CH—Ar6-CH=CH—  (5)

Herein, Ar4, Ar5, and Ar6, which are different from each other, are arylene groups or divalent heterocyclic compound groups each forming a conjugated bond continuous to the vinylene group, and at least one of Ar4, Ar5 and Ar6 is an arylene or heterocyclic compound group having at least one substituent selected from the class consisting of alkyl, alkoxy or alkylthio groups of 4 to 22 carbon atoms, aryl or aryloxy groups of 6 to 60 carbon atoms, and heterocyclic compound groups of 4 to 60 carbon atoms.

Preferred among these groups are phenylene, substituted phenylene, biphenylene, substituted biphenylene, naphthalene diyl, substituted naphthalene diyl, anthracene-9,10-diyl, substituted anthracene-9,10-diyl, pyridine-2,5-diyl, substituted pyridine-2,5-diyl, thienylene, and substituted thienylene groups. Phenylene, biphenylene, naphthalene diyl, pyridine-2,5-diyl, and thienylene groups are more preferred.

With respect to the substituent, examples of the alkyl group having 1 to 20 carbon atoms include methyl, ethyl, propyl, butyl, pentyl, hexyl, heptyl, octyl, decyl and lauryl, with the methyl, ethyl, pentyl, hexyl, heptyl and octyl being preferred. Examples of the alkoxy group having 1 to 20 carbon atoms include methoxy, ethoxy, propoxy, butoxy, pentyloxy, hexyloxy, heptyloxy, octyloxy, decyloxy, and lauryloxy, with the methoxy, ethoxy, pentyloxy, hexyloxy, heptyloxy, and octyloxy being preferred. Examples of the alkylthio group include methylthio, ethylthio, propylthio, butylthio, pentylthio, hexylthio, heptylthio, octylthio, decylthio, and laurylthio, with the methylthio, ethylthio, pentylthio, hexylthio, heptylthio, and octylthio being preferred. Examples of the aryl group include phenyl, 4-($C_1$–$C_{12}$)alkoxyphenyl, 4-($C_1$–$C_{12}$)alkylphenyl, 1-naphthyl, and 2-naphthyl. Phenoxy is a typical aryloxy group. Exemplary of the heterocyclic compound group are 2-thienyl, 2-pyrrolyl, 2-furyl, and 2-, 3- or 4-pyridyl.

When conjugated polymers comprising recurring units selected from the above-mentioned units form a thin film exhibiting such properties that the difference between the peak wavelength of its absorption spectrum and the peak wavelength of its fluorescent spectrum is at least 120 nm, they are luminescent materials having a high fluorescence quantum yield.

Of the conjugated polymers comprising recurring units selected from the above-mentioned units, those copolymers containing 0.01 to 40 mol % of the recurring units whose optical absorption edge energy is minimum are preferred. From these recurring units, a choice is preferably made of those recurring units which respectively form homopolymers between which the difference in optical absorption edge energy is at least 0.05 eV, because they form luminescent materials having a very high fluorescence quantum yield. To this end, at least two different types of chemical structures must be selected.

Further preferably, Ar1, Ar2 and Ar3 are selected from different chemical structures. The recurring units between which the difference in optical absorption edge energy is at least 0.05 eV are exemplified by those in which Ar1, Ar2 and Ar3 have substituents, at least one of which is an alkoxy group, alkylthio group, aryloxy group or heterocyclic compound group of at least 4 carbon atoms, or one or two of Ar1, Ar2 and Ar3 are selected from heterocyclic compound groups.

With respect to the recurring units containing Ar4, Ar5, and Ar6, those recurring units in which Ar4, Ar5, and Ar6 are different from each other, and Ar4, Ar5, and Ar6 have substituents, at least one of which is an alkoxy group, alkylthio group, aryloxy group or heterocyclic compound group of at least 4 carbon atoms, or one of Ar4 and Ar6 is a heterocyclic compound group provide conjugated polymers having a high fluorescence yield.

It is noted that the conjugated polymers may be random, block or graft copolymers, or polymers having an intermediate structure, for example, random copolymers with partial block structures. From the standpoint of obtaining copolymers having a high fluorescence quantum yield, random copolymers with partial block structures and block or graft copolymers are preferred to fully random copolymers.

The preferred solvents for the polymeric fluorescent materials according to the invention are chloroform, methylene chloride, dichloroethane, tetrahydrofuran, toluene, xylene, etc. The polymeric fluorescent materials may be dissolved in these solvents in amounts of at least 0.1% by weight although the solubility depends on the structure and molecular weight of polymeric fluorescent materials. In order to obtain polymers having good film-forming abilities such as solvent solubility, it is preferred that in the combination of Ar1, Ar2 and Ar3 or the combination of Ar4, Ar5 and Ar6, at least one is an aryl or heterocyclic compound group which is nuclearly substituted with at least one substituent selected from the class consisting of alkyl, alkoxy and alkylthio groups of 4 to 22 carbon atoms, aryl and aryloxy groups of 6 to 60 carbon atoms, and heterocyclic compound groups of 4 to 60 carbon atoms.

These substituents are exemplified below. Examples of the alkyl group having 4 to 22 carbon atoms include butyl, pentyl, hexyl, heptyl, octyl, decyl and lauryl, with the pentyl, hexyl, heptyl and octyl being preferred. Examples of the alkoxy group having 4 to 22 carbon atoms include butoxy, pentyloxy, hexyloxy, heptyloxy, octyloxy, decyloxy, and lauryloxy, with the pentyloxy, hexyloxy, heptyloxy, and octyloxy being preferred. Examples of the alkylthio group include butylthio, pentylthio, hexylthio, heptylthio, octylthio, decylthio, and laurylthio, with the pentylthio, hexylthio, heptylthio, and octylthio being preferred. Examples of the aryl group include phenyl, 4-($C_1$–$C_{12}$) alkoxyphenyl, 4-($C_1$–$C_{12}$)alkylphenyl, 1-naphthyl, and 2-naphthyl. Phenoxy is a typical aryloxy group. Exemplary of the heterocyclic compound group are 2-thienyl, 2-pyrrolyl, 2-furyl, and 2-, 3- or 4-pyridyl.

From these recurring units, a choice is preferably made of those recurring units which respectively form homopolymers between which the difference in optical absorption edge energy is at least 0.05 eV. Also, from the standpoint of obtaining copolymers with a high solubility, the content in the polymer of the recurring units having these substituents should preferably be 5 to 100 mol %, more preferably 15 to 100 mol %.

The degree of polymerization of the inventive polymer is not critical and varies with the type and proportion of recurring structures. From the film-forming standpoint, the total number of recurring structures is preferably from about 3 to 10,000, more preferably from about 3 to 3,000, most preferably from about 4 to 2,000.

In fabricating organic EL devices, when films are formed from solutions using these polymers soluble in organic solvents, it is simply required to apply the solution and remove the solvent by drying. Even when the polymer is mixed with a charge transporting material to be described later, a similar procedure is applicable. This is very advantageous in the manufacture.

Typical of the inventive copolymers are arylene vinylene copolymers. Their synthesis method is not critical. For example, copolymers can be formed using a method similar to the methods described in JP-A 1-254734 and 1-79217. More particularly, one exemplary method is a hydrogen halide-removing method of copolymerizing two or more corresponding bis(methyl halide) compounds, for example, 2,5-diethyl-p-xylylene dibromide, 2,5-diheptyloxy-p-xylylene dibromide and p-xylylene dibromide in a xylene/tert-butyl alcohol mixture in the presence of tert-butoxypotassium. Random copolymers are generally formed by this method although block copolymers can be formed using oligomers.

Also useful is Witting reaction in which corresponding bis(methyl halide) compounds, for example, 2,5-diethyl-p-xylylene dibromide and 2,5-diheptyloxy-p-xylylene dibromide are reacted with triphenylphosphine in N,N-dimethylformamide solvent to synthesize a phosphonium salt, which is polymerized with a corresponding dialdehyde compound, for example, terephthalaldehyde in ethyl alcohol in the presence of lithium ethoxide. To form a copolymer, two or more diphosphonium salts and/or two or more dialdehyde compounds may be reacted. Another exemplary process is a sulfonium salt-decomposing process in which a corresponding sulfonium salt is polymerized in the presence of alkali, followed by sulfonium salt-removing treatment. When these polymers are used as the luminescent material in organic EL devices, they are preferably purified after synthesis as by re-precipitation or chromatographic fractionation because luminescent characteristics are governed by their purity.

The structure of the organic EL device which is fabricated using the luminescent material according to the invention is not critical insofar as the luminescent material of the above-mentioned polymer is used in the light emitting layer disposed between a pair of electrodes at least one of which is transparent or translucent. Any of well-known structures may be employed. Exemplary is a structure wherein a light emitting layer of the polymeric fluorescent material mentioned above or a mixture of the polymeric fluorescent material and a charge transporting material (which is used to encompass both an electron transporting material and a hole transporting material) is sandwiched between a pair of electrodes. Also useful is a structure wherein an electron transporting layer comprising an electron transporting material is interleaved between the light emitting layer and the electron injecting electrode and/or a hole transporting layer comprising a hole transporting material is interleaved between the light emitting layer and the hole injecting electrode.

It is also encompassed within the scope of the invention that each of the light emitting layer and the charge transporting layer is either a single layer or a combination of two or more layers. Further, in the light emitting layer, a luminescent material other than the polymeric fluorescent material may be used in admixture. A layer in which the polymeric fluorescent material and/or charge transporting material is dispersed in a polymer may also be used.

The charge transporting materials used along with the polymer according to the invention, that is, electron transporting materials and hole transporting materials may be selected from well-known ones and are not particularly limited. Exemplary hole transporting materials include pyrazoline derivatives, arylamine derivatives, stilbene derivatives, and triphenyldiamine derivatives. Exemplary electron transporting materials include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and metal complexes of 8-hydroxyquinoline and derivatives thereof.

More illustratively, useful charge transporting materials are described, for example, in JP-A 63-70257, 63-175860, 2-135359, 2-135361, 2-209988, 3-37992, and 3-152184. Preferred hole transporting materials are triphenyldiamine derivatives. Preferred electron transporting materials include oxadiazole derivatives, benzoquinone and derivatives thereof, anthraquinone and derivatives thereof, and metal complexes of 8-hydroxyquinoline and derivatives thereof. The especially preferred hole transporting material is 4,4-bis(N-(3-methylphenyl)-N-phenylamino)biphenyl. The especially preferred electron transporting materials are 2-(4-biphenylyl)-5-(4-t-butylphenyl)-1,3,4-oxadiazole, benzoquinone, anthraquinone, and tris(8-quinolinol) aluminum. Among these compounds, either one or both of the electron transporting compound and the hole transporting compound may be used. They may be used alone or in admixture of two or more.

When a charge injecting layer of organic material is disposed between a light emitting layer and an electrode, any of these charge transporting materials may be used to form an organic charge injecting layer. In case a charge transporting material is used in admixture with a luminescent material in the light emitting layer, the amount of the charge transporting material used varies with the type and other factors of a particular compound used and may be determined, with such factors taken into account, so as to fall within the range that ensures a film-forming ability and does not impair luminescent characteristics. Usually, the amount of the charge transporting material used is 1 to 40% by weight, more preferably 2 to 30% by weight based on the luminescent material.

The luminescent material which can be used with the polymeric fluorescent material according to the invention may be selected from well-known luminescent materials, for example, naphthalene derivatives, anthracene and derivatives thereof, perylene and derivatives thereof, polymethine dyes, xanthene dyes, coumarin dyes, and cyanine dyes, metal complexes of 8-hydroxyquinoline and derivatives thereof, aromatic amines, tetraphenylcyclopentadiene and derivatives thereof, tetraphenylbutadiene and derivatives thereof. Illustratively, a choice may be made of the materials described in JP-A 57-51781 and 59-194393, for example.

On the electrode is formed a light emitting layer comprising the above-mentioned polymer as a luminescent material or the polymer and a charge transporting material. The light emitting layer is formed by coating processes such as spin coating, casting, dipping, bar coating, and roll coating processes, using solutions, mix solutions or melts of the above materials. Preferably the layer is formed by coating processes such as spin coating, casting, dipping, bar coating, and roll coating processes, using solutions or mix solutions.

Where the conjugated polymer fluorescent material is used, the light emitting layer has a thickness of 0.5 nm to 10 $\mu$m, preferably 1 nm to 1 $\mu$m. In order to increase the current density for improving the luminous efficiency, the light emitting layer preferably has a thickness of 10 to 500 nm. When a thin film is to be formed by the coating process, the coating is desirably heat dried in vacuum or in an inert atmosphere at a temperature of 30 to 200° C., more preferably 60 to 100° C., for removing the solvent. When such a heat drying step is necessary, it is preferred to form an inorganic charge injecting layer, to be described below, between the light emitting layer and the electrode.

The organic EL device of the invention has at least an inorganic insulative electron injecting and transporting layer and preferably both an inorganic insulative electron injecting and transporting layer and an inorganic insulative hole injecting and transporting layer as the inorganic insulative charge injecting layer between the light emitting layer and a pair of electrodes. The provision of these charge injecting layers ensures efficient injection of electric charges into the light emitting layer to produce the desired luminescence.

The inorganic insulative electron injecting and transporting layer is composed of three components: first, second and third components (the third component being also designated a stabilizer). This eliminates a need to form a special electrode having an electron injecting function and permits a metal electrode having relatively high stability and good conductivity to be used. And the electron injecting and transporting efficiency of the inorganic insulative electron injecting and transporting layer is improved, and the lifetime of the device is prolonged.

The inorganic insulative electron injecting and transporting layer contains at least one oxide selected from the group consisting of lithium oxide ($Li_2O$), rubidium oxide ($Rb_2O$), potassium oxide ($K_2O$), sodium oxide ($Na_2O$), nd cesium oxide ($Cs_2O$), as the first component. These oxides may be used alone or in admixture of two or more. The mixture of two or more oxides may have an arbitrary mix ratio. Of these oxides, lithium oxide ($Li_2O$) is most preferred, while rubidium oxide ($Rb_2O$), potassium oxide ($K_2O$) and sodium oxide ($Na_2O$) are next preferred in the described order. When these oxides are used in admixture, the mixture should preferably contain at least 40 mol %, and especially at least 50 mol % of lithium oxide and rubidium oxide combined.

The inorganic insulative electron injecting and transporting layer contains at least one oxide selected from the group consisting of strontium oxide (SrO), magnesium oxide (MgO), and calcium oxide (CaO) as the second component. These oxides may be used alone or in admixture of two or more. The mixture of two or more oxides may have an arbitrary mix ratio. Of these oxides, strontium oxide (SrO) is most preferred, magnesium oxide (MgO) is second best, and calcium oxide (CaO) is third best. When these oxides are used in admixture, the mixture should preferably contain at least 40 mol % of strontium oxide.

The inorganic insulative electron injecting and transporting layer contains silicon oxide ($SiO_2$) and/or germanium oxide ($GeO_2$) as the third component or stabilizer. Either one or both of silicon oxide and germanium oxide may be used. The mixture of silicon oxide and germanium oxide may have an arbitrary mix ratio.

These oxides are generally present in stoichiometric composition, but may deviate more or less therefrom.

Also preferably, the inorganic insulative electron injecting and transporting layer according to the invention contains the respective components in the following amounts:

first component: 5 to 95 mol %, more preferably 50 to 90 mol %, second component: 5 to 95 mol %, more preferably 50 to 90 mol %, and third component: 0.5 to 20 mol %, more preferably 5 to 10 mol %, based on the entire components, provided that the respective components are calculated as SrO, MgO, CaO, $Li_2O$, $Rb_2O$, $K_2O$, $Na_2O$, $Cs_2O$, $SiO_2$, and $GeO_2$.

The thickness of the inorganic insulative electron injecting and transporting layer is not critical although it is preferably about 0.1 to 2 nm, especially about 0.3 to 0.8 nm thick.

The inorganic insulative electron injecting and transporting layer may be formed by various physical and chemical thin-film forming processes such as sputtering and electron beam (EB) vapor deposition, with the sputtering process being preferred.

When the inorganic insulative electron injecting layer is formed by sputtering, the sputtering gas is preferably under a pressure of 0.1 to 1 Pa during sputtering. The sputtering gas used may be an inert gas commonly used in conventional sputtering apparatus, such as Ar, Ne, Xe or Kr. If necessary, $N_2$ may be used. The sputtering atmosphere may be the sputtering gas in admixture with 1 to 99% of $O_2$. The target used is the above-mentioned oxide while either single source sputtering or multi-source sputtering is acceptable. Often, the target is a mix target containing the main component, auxiliary component and additives. A film deposited therefrom has a composition substantially equivalent to or slightly oxygen poorer than that of the target.

The sputtering process used may be a high-frequency sputtering process using an RF power supply or DC sputtering process, with the RF sputtering being preferred. The power to the sputtering apparatus is preferably in the range of 0.1 to 10 W/cm² for RF sputtering while the deposition rate is preferably 0.1 to 50 nm/min, especially 1 to 10 nm/min.

It is noted that when the inorganic electron injecting and transporting layer is deposited, the organic layer or the like can be subjected to ashing and hence, damaged. Under such a situation, it is recommended that the inorganic electron injecting layer is deposited as two layers. That is, the layer is initially thinly deposited in the absence of oxygen and then thickly in the presence of oxygen. The thickness reached in the absence of oxygen is preferably about ⅕ to about ⅘ of the overall thickness. The oxygen poor layer which is deposited in the absence of oxygen is preferably adjusted to about 60 to 90% of the normal oxygen content. The oxidized layer which is deposited in the presence of oxygen is available in the stoichiometric composition of normal oxide although it may deviate somewhat from the stoichiometry. Accordingly, the difference of oxygen content between the oxygen poor layer and the oxidized layer is preferably at least 10%, especially at least 20%. Also, the oxygen content may continuously vary within the above-defined range.

The temperature of the substrate during deposition is from room temperature (25° C.) to about 150° C.

The inorganic insulative hole injecting and transporting layer which is provided in the preferred embodiment is composed of an oxide of silicon and/or germanium as a main component.

The main component has an average composition represented by the formula:

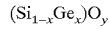

$(Si_{1-x}Ge_x)O_y$ wherein $0 \leq x \leq 1$ and $1.7 \leq y \leq 1.99$, as analyzed by Rutherford back-scattering.

By controlling the oxide as the main component of the inorganic insulative hole injecting and transporting layer so as to fall in the above compositional range, holes can be efficiently injected from the hole injecting electrode into the organic layer on the light emitting layer side. Additionally, migration of electrons from the organic layer to the hole injecting electrode is restrained, and effective recombination of holes and electrons in the light emitting layer is ensured. Since hole injection and transportation is intended, no light emission occurs with a reverse bias voltage applied. The organic EL device of the invention has both the advantages of inorganic material and the advantages of organic material and is effectively applicable to displays of the time-division drive mode which are required to produce a high light emission luminance. The organic EL device of the invention produces a luminance comparable to that of prior art devices having an organic hole injecting layer. Owing to high heat resistance and weather resistance, the organic EL device of the invention has a longer service life than the prior art devices and develops minimal leaks and dark spots. The use of an inexpensive, readily available inorganic material rather than relatively expensive organic materials offers the advantages of easy manufacture and a reduced manufacture cost.

Letter y representative of the oxygen content is from 1.7 to 1.99. If y is outside this range, the layer has a reduced hole injecting capability, leading to a drop of luminance. Preferably y is from 1.85 to 1.98.

The inorganic insulative hole injecting and transporting layer may be a thin film consisting essentially of silicon oxide, germanium oxide, or a mixture of silicon oxide and germanium oxide. Letter x representative of the germanium to silicon ratio is from 0 to 1. Preferably x is up to 0.4, more preferably up to 0.3, especially up to 0.2.

Alternatively, x is preferably at least 0.6, more preferably at least 0.7, especially at least 0.8.

The oxygen content is given as an average value for the film as analyzed by Rutherford back-scattering.

In addition to the oxide, the hole injecting layer may contain up to 10 at % in total of impurities such as Ne, Ar, Kr and Xe used as the sputtering gas. Preferably the hole injecting layer contains about 0.01 to 2%, more preferably 0.05 to 1.5% by weight of Ne, Ar, Kr and Xe. These impurity elements may be contained alone or in admixture of two or more. The mixture may be of two or more impurity elements in an arbitrary ratio.

These elements are used as the sputtering gas and thus introduced into the inorganic insulative hole injecting and transporting layer during its formation. If the content of impurity elements is too high, the layer would lose the trapping capability and hence the desired performance.

The amount of sputtering gas used in film formation is determined by the pressure, the flow rate ratio of sputtering gas to oxygen, deposition rate, and other factors, and especially the pressure. In order to control the content of sputtering gas in the deposited film so as to fall within the above-described range, it is preferred to effect film deposition in higher vacuum, specifically in a vacuum of 1 Pa or lower, especially 0.1 to 1 Pa.

As long as the overall hole injecting layer has the above-described composition on the average, the composition of the hole injecting layer need not be uniform. A layer structure having a graded concentration in a thickness direction is acceptable. In this case, the hole injecting layer is preferably oxygen poorer on the interface with the organic layer (or light emitting layer).

The inorganic insulative hole injecting and transporting layer is normally amorphous.

The thickness of the inorganic insulative hole injecting layer is not critical although an appropriate thickness is about 0.05 nm to about 10 nm, more preferably about 0.1 nm to about 5 nm, especially about 1 to about 5 nm or about 0.5 to about 3 nm. Hole injection would become insufficient when the thickness of the hole injecting layer is outside the range.

Methods for preparing the inorganic insulative hole injecting layer include various physical and chemical thin film forming methods such as sputtering and electron beam (EB) vapor deposition, with the sputtering being preferred.

When the inorganic insulative hole injecting layer is formed by sputtering, the sputtering gas is preferably under a pressure of 0.1 to 1 Pa during sputtering. The sputtering gas may be any of inert gases used in conventional sputtering equipment, for example, Ar, Ne, Xe and Kr. Nitrogen $(N_2)$ gas may be used if necessary. Reactive sputtering may be carried out in an atmosphere of the sputtering gas mixed with 1 to 99% of oxygen $(O_2)$ gas. The target used herein is the above-described oxide or oxides, and either single source or multiple source sputtering may be carried out.

The sputtering process may be an RF sputtering process using an RF power source or a DC reactive sputtering process, with the former being preferred. The power of the sputtering equipment is preferably in the range of about 0.1 to about 10 W/cm² for RF sputtering. The deposition rate is preferably in the range of about 0.5 to about 10 nm/min., especially about 1 to about 5 nm/min. The substrate is kept at room temperature (25° C.) to about 150° C. during deposition.

Reactive sputtering is acceptable. When nitrogen is incorporated, the reactive gas may be $N_2$, $NH_3$, NO, $NO_2$, $N_2O$, etc. When carbon is incorporated, the reactive gas may be $CH_4$, $C_2H_2$, CO, etc. These reactive gases may be used alone or in admixture of two or more.

By providing the inorganic hole injecting layer and the inorganic electron injecting layer, the organic EL device of the invention is improved in heat resistance and weather resistance so that a longer lifetime is expectable. The use of inexpensive, readily available inorganic materials rather than relatively expensive organic materials offers the advantages of easy manufacture and a reduced manufacture cost. Furthermore, the invention improves the connection to electrodes of inorganic materials which was a problem in the prior art. This minimizes the occurrence of leakage current and the development of dark spots.

In the organic EL device of the invention, a hole injecting and transporting layer of organic material may be provided instead of the inorganic hole injecting and transporting layer. In this embodiment, when a heat polymerization step is required in forming a light emitting layer, the layer that underlies the light emitting layer should preferably be an inorganic electron injecting and transporting layer, because heating can reach about 300° C. on the high temperature side.

For the hole injecting and transporting layer of organic material, it is preferable to use the following hole injecting and transporting materials.

The hole injecting and transporting compound is preferably selected from amine derivatives having strong fluorescence, for example, triphenyldiamine derivatives which are hole transporting materials, styrylamine derivatives and amine derivatives having an aromatic fused ring.

As the hole injecting and transporting compound, there may be used various organic compounds as described, for example, in JP-A 63-295695, 2-191694, 3-792, 5-234681, 5-239455, 5-299174, 7-126225, 7-126226, and 8-100172, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. These compounds may be used alone or in admixture of two or more. When two or more of these compounds are used, they may be formed as separate layers or mixed.

When the hole injecting layer is formed below the light emitting layer whose formation requires a heat polymerization step, the hole injecting layer must be resistant to heat. Preferred in this embodiment are hole injecting and transporting compounds having a glass transition temperature of at least 200° C., more preferably at least 300° C., most preferably at least 350° C.

The thicknesses of the organic hole injecting layer and the organic electron injecting layer are not critical and vary with a particular formation technique. Usually, their thickness is preferred to range from about 5 nm to about 500 nm, especially about 10 nm to about 300 nm. When the hole or electron injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer.

In forming the organic hole injecting and transporting layer and the organic electron injecting layer, vacuum evaporation is preferably used because homogeneous thin films are available. By utilizing vacuum evaporation, there is obtained a homogeneous thin film which is amorphous or has a crystal grain size of less than 0.2 μm. If the grain size is more than 0.2 μm, uneven light emission would take place and the drive voltage of the device must be increased with a substantial drop of hole or electron injection efficiency.

The conditions for vacuum evaporation are not critical although a vacuum of $10^{-4}$ Pa or lower and a deposition rate of about 0.01 to 1 nm/sec are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

Further preferably, a shield plate may be provided on the device in order to prevent the organic layers and electrodes from oxidation. In order to prevent the ingress of moisture, the shield plate is attached to the substrate through an adhesive resin layer for sealing. The sealing or filler gas is preferably an inert gas such as argon, helium, and nitrogen. The filler gas should preferably have a moisture content of less than 100 ppm, more preferably less than 10 ppm, especially less than 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 μm, more preferably about 1 to 10 μm, most preferably about 2 to 8 μm. Particles of such diameter should preferably have a length of less than about 100 μm. The lower limit of length is not critical although it is usually equal to or more than the diameter.

When a shield plate having a recess is used, the spacer may be used or not. When used, the spacer should preferably have a diameter in the above-described range, especially 2 to 8 μm.

The spacer may be premixed in a sealing adhesive or mixed with a sealing adhesive at the time of bonding. The content of the spacer in the sealing adhesive is preferably 0.01 to 30% by weight, more preferably 0.1 to 5% by weight.

Any of adhesives which can maintain stable bond strength and gas tightness may be used although UV-curable epoxy resin adhesives of cation curing type are preferred.

The substrate on which the organic EL structure is formed may be selected from amorphous substrates of glass and quartz and crystalline substrates of Si, GaAs, ZnSe, ZnS, GaP, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. Since the substrate is often situated on the light exit side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescence quantum yield and desirably exhibits strong absorption in the EL wavelength region. In practice, laser dyes are appropriate. Use may be made of rhodamine compounds, perylene compounds, cyanine compounds, phthalocyanine compounds (including sub-phthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable.

The light absorbing material is used when the light absorption of the fluorescent material is short and may be omitted if unnecessary. The light absorbing material may also be selected from materials which do not cause extinction of fluorescence of the fluorescent material.

The organic EL device of the invention is generally of the dc or pulse drive type while it can be of the ac drive type. The applied voltage is generally about 2 to 30 volts.

Figure 2:
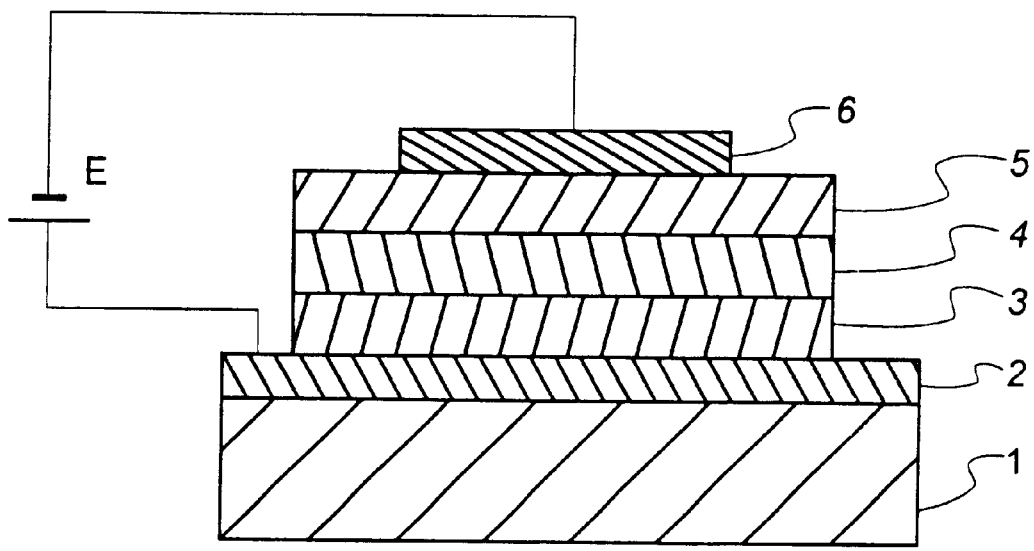
FIG. 2 is a schematic cross-sectional view illustrating the configuration of an organic EL device according to a second embodiment of the invention.
Figure 3:
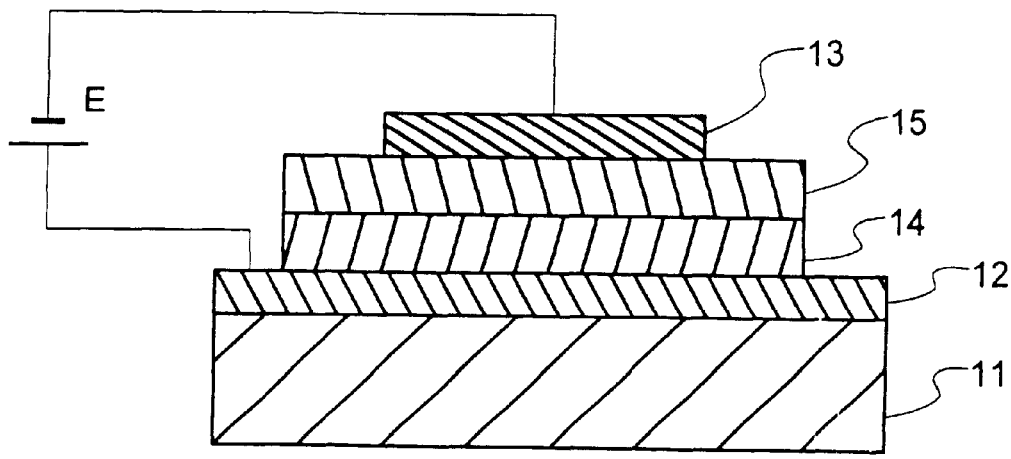
FIG. 3 is a schematic cross-sectional view illustrating the configuration of a prior art organic EL device.
Figure 4:
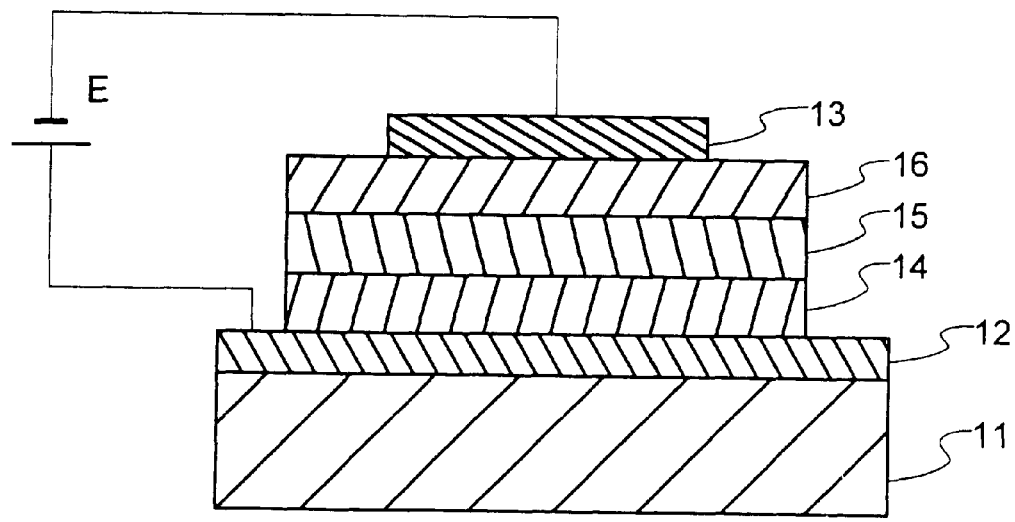
FIG. 4 is a schematic cross-sectional view illustrating the configuration of another prior art organic EL device.

As shown in FIG. 1, the organic EL device of the invention may have the successively stacked configuration of substrate 1/hole injecting electrode 2/light emitting layer 4/inorganic insulative electron injecting layer 5/negative electrode (or electron injecting electrode) 6. As shown in FIG. 2, the device may have the successively stacked configuration of substrate 1/hole injecting electrode 2/inorganic insulative hole injecting and transporting layer 3/light emitting layer 4/inorganic insulative electron injecting layer 5/negative electrode (or electron injecting electrode) 6. The inorganic insulative hole injecting layer may be replaced by a hole injecting layer of organic material. The order of layer stacking may be reversed, that is, a reversely stacked configuration is acceptable. Among these configurations, a choice may be properly made in accordance with the specifications of the desired display and manufacturing process. In the configurations of FIGS. 1 and 2, a drive power supply E is connected between the hole injecting electrode 2 and the negative electrode (or electron injecting electrode) 6.

The device of the invention may have a multi-stage configuration of electrode layer/inorganic layer (inorganic insulative hole injecting layer or inorganic insulative electron injecting layer) and light emitting layer/electrode layer/ inorganic layer and light emitting layer/electrode layer/ inorganic layer and light emitting layer/electrode layer, or further repeated layers. Such a multi-stage configuration is effective for adjusting or multiplying the color of emitted light.

The organic EL device of the invention is applicable as displays, optical pickups for use in writing and reading of memories, repeaters in transmission lines for optical communication, photocouplers, and other optical devices.

EXAMPLE

Example 1

A substrate of (7059) glass by Corning Glass Works was scrubbed using a neutral detergent.

By RF magnetron sputtering from a target of ITO oxide, a hole injecting electrode layer of ITO having a thickness of 200 nm was formed on the substrate at a temperature of 250° C.

After its ITO electrode-bearing surface was cleaned with $UV/O_3$, the substrate was secured by a holder for spin coating.

A methanol solution of a PPV precursor having a concentration of 1 g of polymer per 10 to 25 g of methanol was spin coated onto the substrate having the inorganic insulative hole injecting layer deposited thereon. This coating was carried out by applying the polymer solution to the entire surface of the substrate and then rotating the substrate at a revolution of up to 5,000 rpm while keeping its upper surface horizontal.

The substrate with the polymer precursor layer was heated for 12 hours in a vacuum oven at a temperature of 300° C. This heat treatment converted the polymer precursor into PPV. The resulting PPV film was 100 to 300 nm thick.

The substrate was transferred to a sputtering chamber, which was evacuated to a vacuum of $1\times10^{-4}$ Pa or lower.

Using a target obtained by mixing raw materials: strontium oxide (SrO), lithium oxide ($Li_2O$), and silicon oxide ($SiO_2$) so that the target consisted of 80 mol % of Sro, 10 mol % of $Li_2O$, and 10 mol % of $SiO_2$, based on the entire components, an inorganic electron injecting and transporting layer was deposited to a thickness of 0.8 nm. Depositing conditions included a substrate temperature of 25° C., sputtering gas Ar, a deposition rate of 1 nm/min, an operating pressure of 0.5 Pa, and an input power of 5 W/cm². The inorganic electron injecting and transporting layer was deposited to a thickness of 0.4 nm while supplying 100 SCCM of 100% Ar as the sputtering gas, and then to a thickness of 0.4 nm while supplying 100 SCCM of a mixture of $Ar/O_2$ (1/1).

With the vacuum kept, Al was evaporated to a thickness of 200 nm to form a negative electrode. A glass shield was sealed to the substrate to enclose the layer structure therein, completing an organic EL device. A comparative sample was fabricated in which the negative electrode was formed on the light emitting layer without forming the inorganic electron injecting layer.

An electric field was applied across the organic EL device in air, which exhibited diode characteristics. When biased to be positive on the ITO side and negative on the Al side, the current flow increased as the voltage increased. A distinct light emission was observed in an ordinary room.

The organic EL devices were driven at a constant current density of 10 mA/cm². The comparative sample exhibited only a luminance of 100 cd/m² whereas the inventive sample produced a luminance of 500 cd/m². The luminance half-life was improved by a factor of more than 5 over the comparative sample.

Example 2

In Example 1, the main component, auxiliary component and stabilizer of the inorganic insulative electron injecting and transporting layer were changed from SrO to MgO, CaO or mixtures of these oxides, from $Li_2O$ to $K_2O$, $Rb_2O$, $K_2O$, $Na_2O$, $Cs_2O$ or mixtures of these oxides, and from $SiO_2$ to $GeO_2$ or oxide mixtures of $SiO_2$ and $GeO_2$, respectively, with substantially equivalent results. Similar results were obtained when the negative electrode forming material was changed from Al to Ag, In, Ti, Cu, Au, Mo, W, Pt, Pd, Ni or alloys thereof.

Example 3

In Example 1, after its ITO electrode-bearing surface was cleaned with $UV/O_3$, the substrate was secured by a holder in a vacuum evaporation chamber, which was evacuated to a vacuum of $1 \times 10^{-4}$ Pa or lower.

Using a target of $SiO_2$, an inorganic insulative hole injecting layer was deposited to a thickness of 2 nm. The sputtering gas used herein was a mixture of Ar and 5% of $O_2$. Depositing conditions included a substrate temperature of 25° C., a deposition rate of 1 nm/min, an operating pressure of 0.5 Pa, and an input power of 5 W/cm². The hole injecting layer thus deposited had a composition of $SiO_{1.9}$.

Thereafter, a PPV film was formed as in Example 1, and an inorganic electron injecting layer, an Al—Li (Li: 7 at %) film, and an Al film were formed, obtaining an organic EL device.

The resulting organic EL device was evaluated as in Example 1, finding substantially equivalent results.

Example 4

Organic EL devices were fabricated as in Example 1 except that in the step of depositing the inorganic insulative hole injecting and transporting layer in Examples 1 to 3, the flow rate of $O_2$ in the sputtering gas was changed and the target used was changed in accordance with the desired layer composition so that the resulting layers had the compositions $SiO_{1.7}$, $SiO_{1.95}$, $GeO_{1.96}$, and $SiO_{0.5}Ge_{0.5}O_{1.92}$, respectively. The devices were tested for emission luminance and life, obtaining substantially equivalent results.

Example 5

Synthesis of polymeric fluorescer

A phosphonium salt (A) was synthesized by reacting 2,5-diethyl-p-xylylene dibromide with triphenylphosphine in N,N-dimethylformamide solvent. Also, a phosphonium salt (B) was synthesized by reacting 2,5-diheptyloxy-p-xylylene dibromide with triphenylphosphine in N,N-dimethylformamide solvent. In ethyl alcohol were dissolved 4.1 parts by weight of phosphonium salt (A), 1.0 part by weight of phosphonium salt (B), and 0.8 part by weight of terephthalaldehyde. An ethyl alcohol solution containing 0.8 part by weight of lithium ethoxide was added dropwise to the ethyl alcohol solution of phosphonium salts and dialdehyde. Polymerization was effected for 3 hours at room temperature. The reaction mixture was allowed to stand overnight at room temperature. The precipitate was collected by filtration, washed with ethyl alcohol, and dissolved in chloroform, to which ethanol was added for re-precipitation. The precipitate was dried in vacuum, obtaining 0.35 part by weight of a polymer. This is designated Polymeric Fluorescer 1. The recurring units of Polymeric Fluorescer 1 are shown below together with their molar ratio as calculated from the ratio of monomer charges.

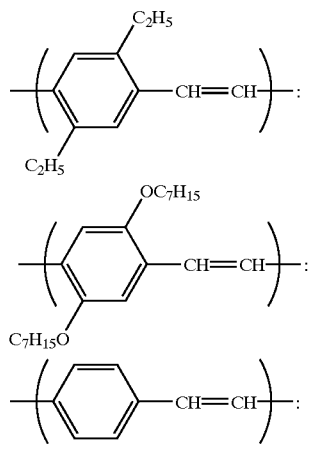

= 40:10:50

This Polymeric Fluorescer 1 has a number average molecular weight of $5.0 \times 10^3$ calculated on the basis of polystyrene. With respect to the structure of Polymeric Fluorescer 1, absorption peaks at 960 cm$^{-1}$ for vinylene, 1520 cm$^{-1}$ for phenylene, 1100 cm$^{-1}$ for ether, and 2860 cm$^{-1}$ for alkyl were found in its infrared absorption spectrum. On $^1$H-NMR analysis using chloroform-d as a solvent, H in phenylene vinylene group (near 6.5 to 8.0 ppm), H of —OCH$_2$— in heptyloxy group (near 3.5 to 4.0 ppm), and H of —CH$_2$— in ethyl group (near 2.5 ppm) were found. The molar ratio of recurring units as calculated from their intensity ratio was substantially coincident with the value calculated from the ratio of monomer charges.

Organic EL devices were fabricated as in Examples 1 to 4, except that a 1.0 wt % chloroform solution of Polymeric Fluorescer 1 was used in the formation of the PPV film. The solution was applied to a thickness of 50 nm by a dipping technique, followed by vacuum drying at 80° C. for one hour, forming the light emitting layer.

The organic EL device was examined as in Example 1, finding equivalent results to Examples 1 to 4.

BENEFITS

There has been described an organic EL device which can take advantage of both organic and inorganic materials, and has an improved efficiency, an extended effective life, and a low cost.

What is claimed is:

1. An organic electroluminescent device comprising a substrate, a hole injecting electrode and an electron injecting electrode formed on the substrate, and an organic material-containing organic layer between the electrodes, said organic layer including a light emitting layer containing a conjugated polymer, said device further comprising an inorganic insulative electron injecting and transporting layer between said light emitting layer and said electron injecting electrode, said inorganic insulative electron injecting and transporting layer comprising at least one oxide selected from the group consisting of lithium oxide, rubidium oxide, potassium oxide, sodium oxide, and cesium oxide as a first component, at least one oxide selected from the group consisting of strontium oxide, magnesium oxide, and calcium oxide as a second component, and silicon oxide, germanium oxide or a mixture of silicon oxide and germanium oxide as a third component.

2. The organic electroluminescent device of claim 1 wherein said inorganic insulative electron injecting and transporting layer contains 5 to 95 mol % of the first component, 5 to 95 mol % of the second component, and 5 to 95 mol % of the third component, based on the entire components.

3. The organic electroluminescent device of claim 1 wherein said inorganic insulative electron injecting and transporting layer has a thickness of 0.1 to 2 nm.

4. The organic electroluminescent device of claim 1 wherein said electron injecting electrode is formed of at least one metal element selected from the group consisting of Al, Ag, In, Ti, Cu, Au, Mo, W, Pt, Pd, and Ni.

5. The organic electroluminescent device of claim 1 further comprising an inorganic insulative hole injecting and transporting layer between said light emitting layer and said hole injecting electrode, said inorganic insulative hole injecting layer comprising silicon oxide or germanium oxide or a mixture of silicon oxide and germanium oxide as a main component, the main component having an average composition represented by the formula: $(Si_{1-x}Ge_x)O_y$ wherein x is from 0 to 1 and y is from 1.7 to 1.99, as analyzed by Rutherford back-scattering.

6. The organic electroluminescent device of claim 5 wherein said inorganic insulative hole injecting and transporting layer has a thickness of 0.1 to 3 nm.

7. The organic electroluminescent device of claim 1, wherein the conjugated polymer is poly(p-phenylene vinylene), optionally substituted on the phenylene ring with a group selected from alkyl, alkoxy, halogen, and nitro.

8. The organic electroluminescent device of claim 1, wherein the conjugated polymer is present in the form of a film having a thickness of 10 nm to 5 μm.

9. The organic electroluminescent device of claim 1, wherein the electron injecting electrode has a thickness of 0.1 to 500 nm.

10. The organic electroluminescent device of claim 1, further comprising an auxiliary electrode disposed on the electron injecting electrode.

11. The organic electroluminescent device of claim 10, wherein the auxiliary electrode has a thickness of 50 to 500 nm.

12. The organic electroluminescent device of claim 1, wherein the hole injecting electrode comprises a material selected from the group consisting of ITO, IZO, $In_2O$, $SnO_2$, and ZnO.

13. The organic electroluminescent device of claim 12, wherein the hole injecting electrode further comprises $SiO_2$.

14. The organic electroluminescent device of claim 1, wherein the hole injecting electrode has a light transmittance of at least 80%.

15. The organic electroluminescent device of claim 1, wherein the hole injecting electrode has a thickness of 50 to 500 nm.

16. The organic electroluminescent device of claim 1, wherein the conjugated polymer is selected from the group consisting of polymers having the following structures (II) to (VIII):

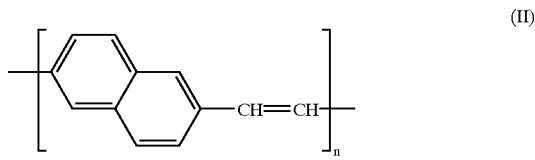

(II)

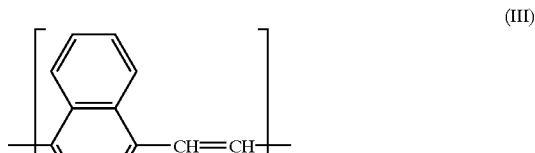

(III)

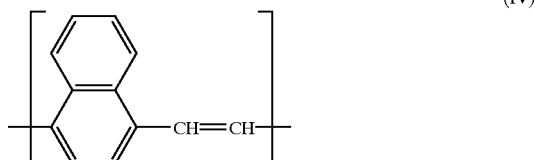

(IV)

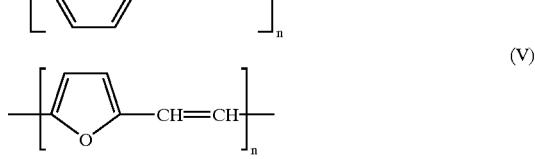

(V)

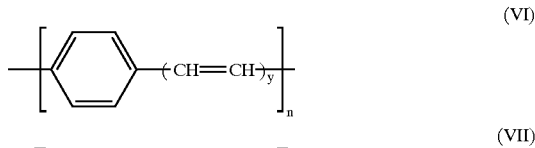

(VI)

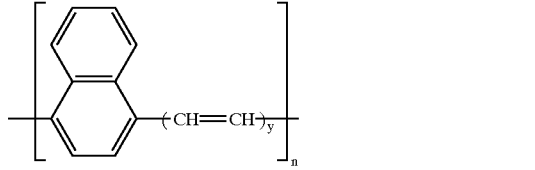

(VII)

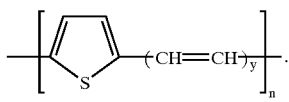

(VIII)

17. The organic electroluminescent device of claim 2, wherein the inorganic insulative electron injecting and transporting layer comprises 50 to 90 mol % of the first component.

18. The organic electroluminescent device of claim 2, wherein the inorganic insulative electron injecting and transporting layer comprises 50 to 90 mol % of the second component.

19. The organic electroluminescent device of claim 2, wherein the inorganic insulative electron injecting and transporting layer comprises 5 to 10 mol % of the third component.

20. The organic electroluminescent device of claim 5, wherein y is from 1.85 to 1.98.

21. The organic electroluminescent device of claim 5, wherein x is from 0 to 0.2.

22. The organic electroluminescent device of claim 5, wherein x is from 0.8 to 1.

23. The organic electroluminescent device of claim 5, wherein the inorganic hole injecting and transporting layer further comprises 0.05 to 1.5% by weight of at least one element selected from the group consisting of Ne, Ar, Kr, and Xe.

24. The organic electroluminescent device of claim 1, further comprising an organic hole injecting and transporting layer disposed between the light emitting layer and the hole injecting electrode, wherein the organic hole injecting and transporting layer comprises at least one organic compound selected from the group consisting of a triaryldiamine, a triphenyldiamine, an aromatic tertiary amine, a hydrazone, a carbazole, a triazole, an imidazole, an oxadiazole having an amino group, and a polythiophene.

25. The organic electroluminescent device of claim 1, further comprising a shield plate attached to the substrate by means of an adhesive.

* * * * *